US007791536B2

(12) United States Patent
Brown et al.

(10) Patent No.: US 7,791,536 B2
(45) Date of Patent: Sep. 7, 2010

(54) HIGH POWER PHASED ARRAY ANTENNA SYSTEM AND METHOD WITH LOW POWER SWITCHING

(75) Inventors: Kenneth W. Brown, Yucaipa, CA (US); Frederick Ahrens, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 204 days.

(21) Appl. No.: 11/821,760

(22) Filed: Jun. 24, 2007

(65) Prior Publication Data

US 2008/0316101 A1 Dec. 25, 2008

(51) Int. Cl.
*H01Q 3/24* (2006.01)

(52) U.S. Cl. .................................... 342/374; 342/368

(58) Field of Classification Search ................ 342/374, 342/368, 373; 330/124 R; 333/109–116
See application file for complete search history.

(56) References Cited

U.S. PATENT DOCUMENTS 3,222,677 A * 12/1965 Fink .......................... 342/350
3,295,134 A * 12/1966 Lowe ......................... 342/368
4,124,852 A * 11/1978 Steudel ...................... 342/374
5,606,283 A * 2/1997 Allen et al. ............. 330/124 R
7,071,873 B2 * 7/2006 Tomasic et al. ............ 342/372
7,178,366 B2 2/2007 Schwertfeger et al.
7,405,695 B2 * 7/2008 Liu ........................... 342/374
2004/0027203 A1 2/2004 Wallis et al.
2007/0013575 A1 1/2007 Lee et al.

FOREIGN PATENT DOCUMENTS

WO WO-2009/002450 12/2008

OTHER PUBLICATIONS

"International Application Serial No. PCT/US2008007712, Written Opinion mailed Sep. 10, 2008", 5 pgs.
"International Application Serial No. PCT/US2008007712, International Search Report mailed Sep. 10, 2008", 3 pgs.

* cited by examiner

*Primary Examiner*—Thomas H Tarcza
*Assistant Examiner*—Cassi Galt
(74) *Attorney, Agent, or Firm*—Schwegman, Lundberg & Woessner, P.A.; Gregory J. Gorrie

(57) ABSTRACT

Embodiments of a switchable high-power transmit module to selectively provide a high-power microwave signal in excess of one kilowatt to one of first and second output paths are disclosed herein. The module includes a switch to receive a lower-power microwave signal from a source, a first ninety-degree coupler for directing power from the switch to first and second paths, a first high-power amplifier disposed in the first path, a second high-power amplifier disposed in the second path, and a second ninety-degree coupler to receive output signals of the first and second amplifiers. The switch is configured to selectively couple the lower-power microwave signal between first and second input ports of the first ninety-degree coupler. When the switch couples the lower-power microwave signal to a selected one of the input ports of the first coupler, signals generated by the first and second high-power amplifiers are combined in the second ninety-degree coupler to provide the high-power microwave output signal on only one of the output paths.

11 Claims, 7 Drawing Sheets

HIGH POWER PHASED ARRAY ANTENNA SYSTEM AND METHOD WITH LOW POWER SWITCHING

BACKGROUND OF THE INVENTION

1. Field of the Invention

The present invention relates to antenna systems. More specifically, the present invention relates to high power microwave antennas, arrays thereof and components therefor.

2. Description of the Related Art

High power microwave antennas are being considered for various area defense applications such as airport protection. For such applications, a high power microwave beam is to be directed to an incoming missile for the purpose of disrupting and confusing the guidance system of the missile to render it incapable of completing its mission. For an airport application, the system would be required to protect aircraft landing and taking off along the airports runway(s). Hence, at least two phased array systems are required, one for each runway direction (180 degrees apart).

Other airport configurations may have multiple runways oriented perpendicularly from each other. These airports could require 3 or 4 phased array systems to protect aircraft in the takeoff and landing scenarios for each runway. Such an airport protection system would be expensive using conventional teachings. The addition of multiple phased array antenna systems will probably make the approach infeasible for airport protection.

Moreover, for the illustrative area defense and other applications, it is necessary or desirable to transmit a considerable amount of energy at a high power level. Unfortunately, the switching of microwave energy at high power levels is problematic and poses a significant cost constraint on any system attempting to do so.

Hence, a need exists in the art for a system or method for irradiating and/or receiving microwave energy at high power levels in large volumes at low cost.

SUMMARY OF THE INVENTION

The need in the art is addressed by the systems and methods of the present invention. In a most general implementation, the inventive system is a module having a first coupler for directing power from a source to first and second paths; a first amplifier disposed in the first path; a second amplifier disposed in the second path; and a second coupler for combining the outputs of the first and second amplifiers.

In a more specific implementation, the module further includes a switch connected to the first coupler. The switch is a single-pole double throw switch. Each coupler is a 90-degree coupler that provides the combined energy output by each amplifier to a first or a second output port based on the position of the switch. The first coupler has first and second inputs, each input connected to a throw of the switch. The inclusion of a variable phase shifter allows for the module to be used to drive an element of a phased array antenna.

For high power applications, multiple such inventive modules may be used to drive the elements of one or more phased arrays pointed in different directions to provide a desired coverage pattern. In this application, in accordance with the present teachings, each module is adapted to switch energy at low power levels to drive one or more apertures with microwave energy at high power levels, that is, at a power level in excess of one kilowatt. The modules can also be configured as receive only or with circulators as transmit/receive modules.

The inventive method provides a technique for switching power at high levels to and from phase array and other antennas and a technique for providing area coverage using multiple phase array antenna arrangements.

BRIEF DESCRIPTION OF THE DRAWINGS

FIG. 1(*b*) is a magnified view of a portion of the antenna of FIG. 1(*a*).

FIG. 1(*c*) is an alternative embodiment of the antenna depicted in FIG. 1(*b*)

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

As mentioned above, the use of microwave radiation for airport protection imposes a requirement on a phased array system to point in 180 degree opposing directions along an airport runway. Under normal circumstances this could be accomplished by constructing two separate phased array apertures, one for each direction. Such a system is disclosed and claimed in copending U.S. patent application Ser. No. 11/423,520 entitled ANTI-MISSILE SYSTEM AND METHOD, filed Jun. 12, 2006 by Kenneth W. Brown et al. , the teachings of which are hereby incorporated herein by reference. For the illustrative application, this may be cost prohibitive due to the enormous average power output requirement from each transmit module.

In accordance with the present teachings, a more cost effective solution is disclosed in which two (or more) phased array apertures share the same transmit module. This is illustrated in FIG. 1.

Figure 1A:
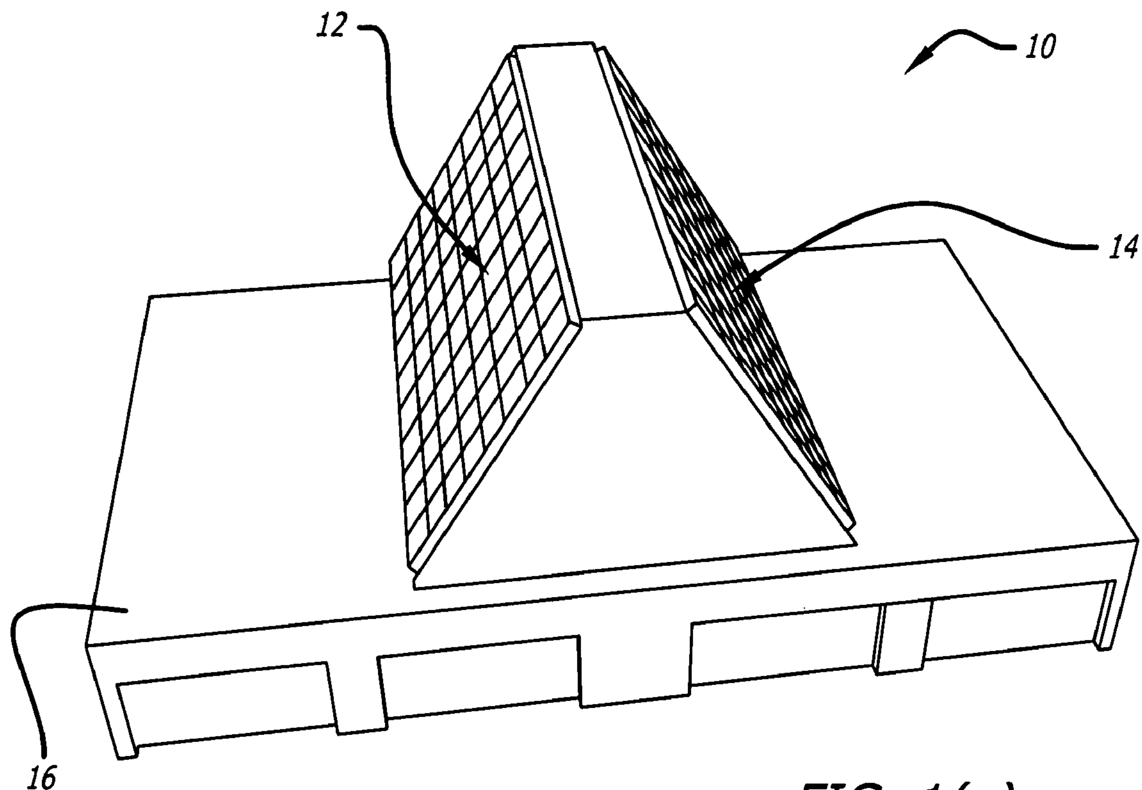
FIG. 1(*a*) is a perspective view of a multiple aperture phase array antenna system implemented in accordance with an illustrative embodiment of the present teachings.
Figure 1B:
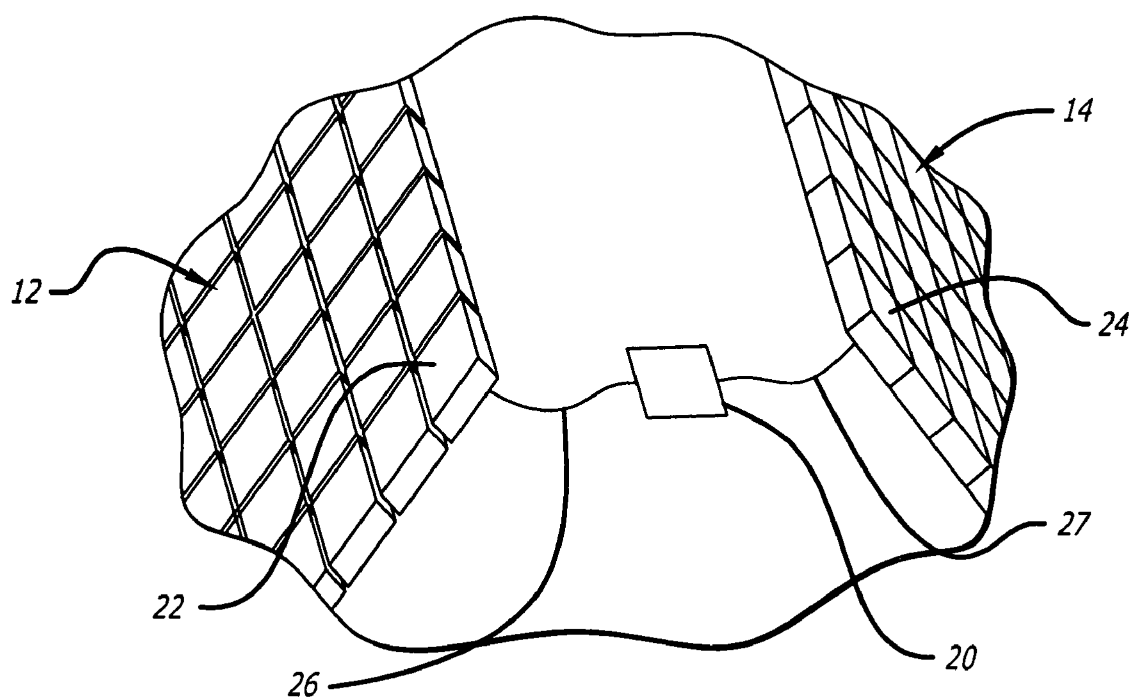
Figure 1C:
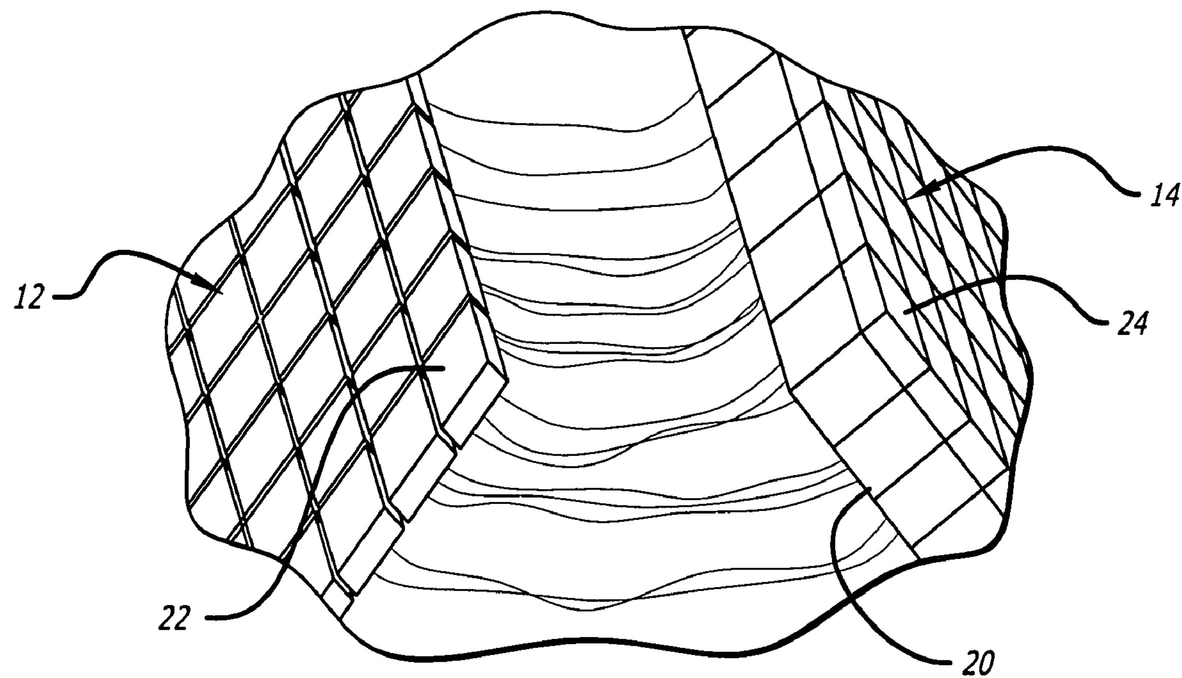

FIG. 1(*a*) is a perspective view of a multiple aperture phase array antenna system implemented in accordance with an illustrative embodiment of the present teachings.

FIG. 1(*b*) is a magnified view of a portion of the antenna of FIG. 1(*a*). As illustrated in FIGS. 1(*a*) and (*b*), in accordance with the present teachings, two apertures 12 and 14 (pointing 180 degrees apart) and mounted on a support structure 16. The arrangement of FIG. 1 is adapted to provide coverage in a separate direction.

The apertures 12 and 14 are fed by the same transmit module 20. The transmit module 20 is paired with an antenna element 22 on the first aperture or array 12 and a second antenna element 24 on a second array 14.

FIG. 1(*c*) is an alternative embodiment of the antenna depicted in FIG. 1(*b*) in which the transmit module 20 is mounted behind one of the arrays 14. In this case, the module 20 feeds an array element 22 on the first array 12 with a coaxial cable. In any event, in the illustrative application, the elements are fed with high power (i.e., in excess of 1 kilowatts) at microwave frequencies via an RF cable 26.

Hence, for the intended application, the T/R module should be capable of switching its output between the two different antenna elements. This is problematic due to the high output power required for the illustrative area defense application and the need to provide switching therefor. In this application, each transmit module may be required to radiate energy at power levels exceeding 1 kilowatts of continuous wave energy. It is currently very difficult to obtain or design a switch that is capable of handling these power levels and even if it were possible, the cost would be prohibitively high. In addition, the high power switch would probably be mechanical in nature making it extremely difficult if not impossible to rapidly switch the phased array beam from one antenna aperture to the next, which may be important for some applications such as airport protection by way of example. In accordance with the present teachings, an inventive switching arrangement is disclosed to address this problem. The inventive arrangement is shown in FIG. 2.

Figure 2:
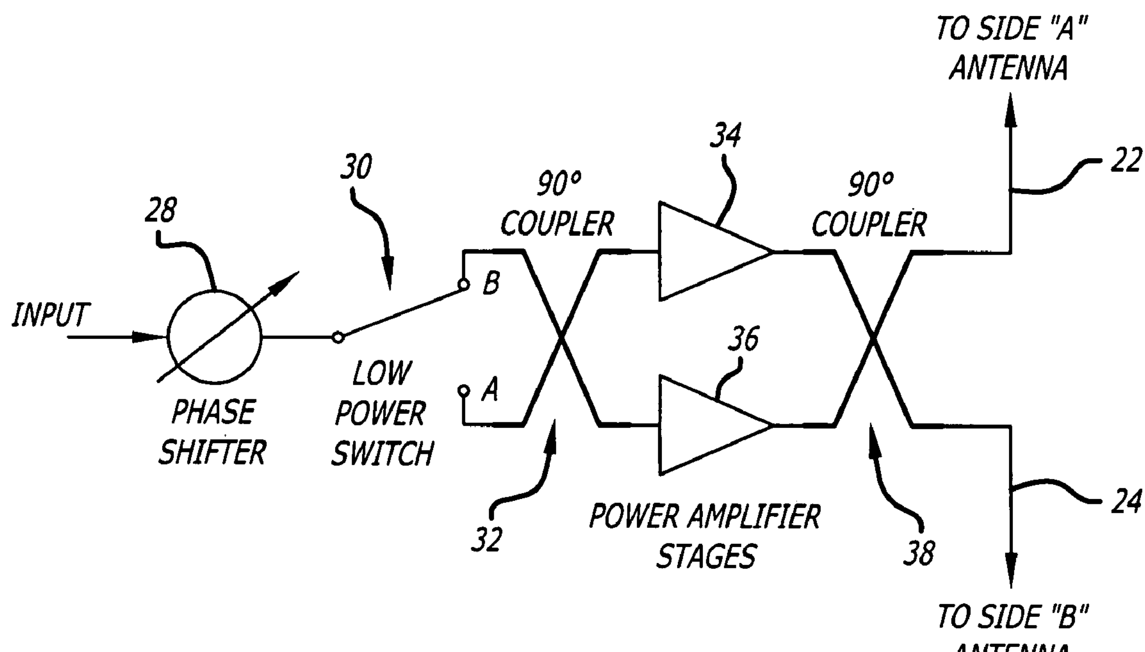
FIG. 2 is a simplified schematic diagram showing an illustrative implementation of a module in accordance with a first embodiment of the present teachings.

FIG. 2 is a simplified schematic diagram showing an illustrative implementation of a module in accordance with a first embodiment of the present teachings. As shown in FIG. 2, a switchable high power transmit module 20 is configured utilizing a low power switch 30. In accordance with the invention, the switch is a single-pole, double-throw switch connected to couple energy from a conventional variable phase shifter 28 to a first 90 degree coupler 32 via the throws (A) and (B) thereof. The switch 30 is selected based on the power, frequency and switching speed requirements of a given application. In the illustrative application, the switch 30 is selected to handle power on the order of milliwatts with a switching speed on the order of microseconds. The first coupler 32 may be a low power coupler etched onto a circuit board or purchased as a discrete component from a manufacturer such as Anaren by way of example. The coupler receives an input at one port and distributes the signal to each of two output ports thus providing two paths. In each path, an amplifier 34 or 36 is disposed. In the illustrative application, the amplifiers are high power microwave amplifiers.

In FIG. 2, the amplifiers output to a second 90-degree coupler 38. In the illustrative application, the second coupler 38 is a high power coupler adapted to handle power at much higher levels (e.g. kilowatts) compared to the first coupler 32.

The second coupler 38 is connected in a reverse direction relative to the first coupler 32 such that energy received at each port is combined and provided on a single output port. Hence, when the switch 30 is at position 'A', the combined outputs of the two amplifiers are fed to antenna element 22 on the first aperture 12 (FIGS. 1(*a*) and (*b*)) via the second coupler 38. Likewise, when the switch 30 is at position 'B', the combined outputs of the two amplifiers are fed to antenna element 24 on the second aperture 14 (FIGS. 1(*a*) and (*b*)) via the second coupler 38.

Consequently, the arrangement of FIG. 2 is adapted to switch energy at low power (on the order of milliwatts) between the inputs of the first 90-degree coupler 32. The 90-degree coupler 32 then feeds two power amplifiers 34 and 36. In the inventive concept, the power amplifiers may be solid state and preferably with high gains (e.g., 60 dB). The two power amplifiers then feed an output 90-degree coupler. Depending on the selected leg of the input coupler, the output power re-combines in only one of the two outputs. Therefore, high power switching in accomplished with a low power switch.

Note that the drawback of the above technique (shown in FIG. 2) is that two power amplifiers are required. However, for high power solid-state systems this is not typically a problem since multiple parallel power stages are often needed to get the desired power output. These multiple stages can be broken up into two separate power amplifiers as shown in FIG. 2 without significantly increasing the cost and complexity of the transmit module.

Figure 3:
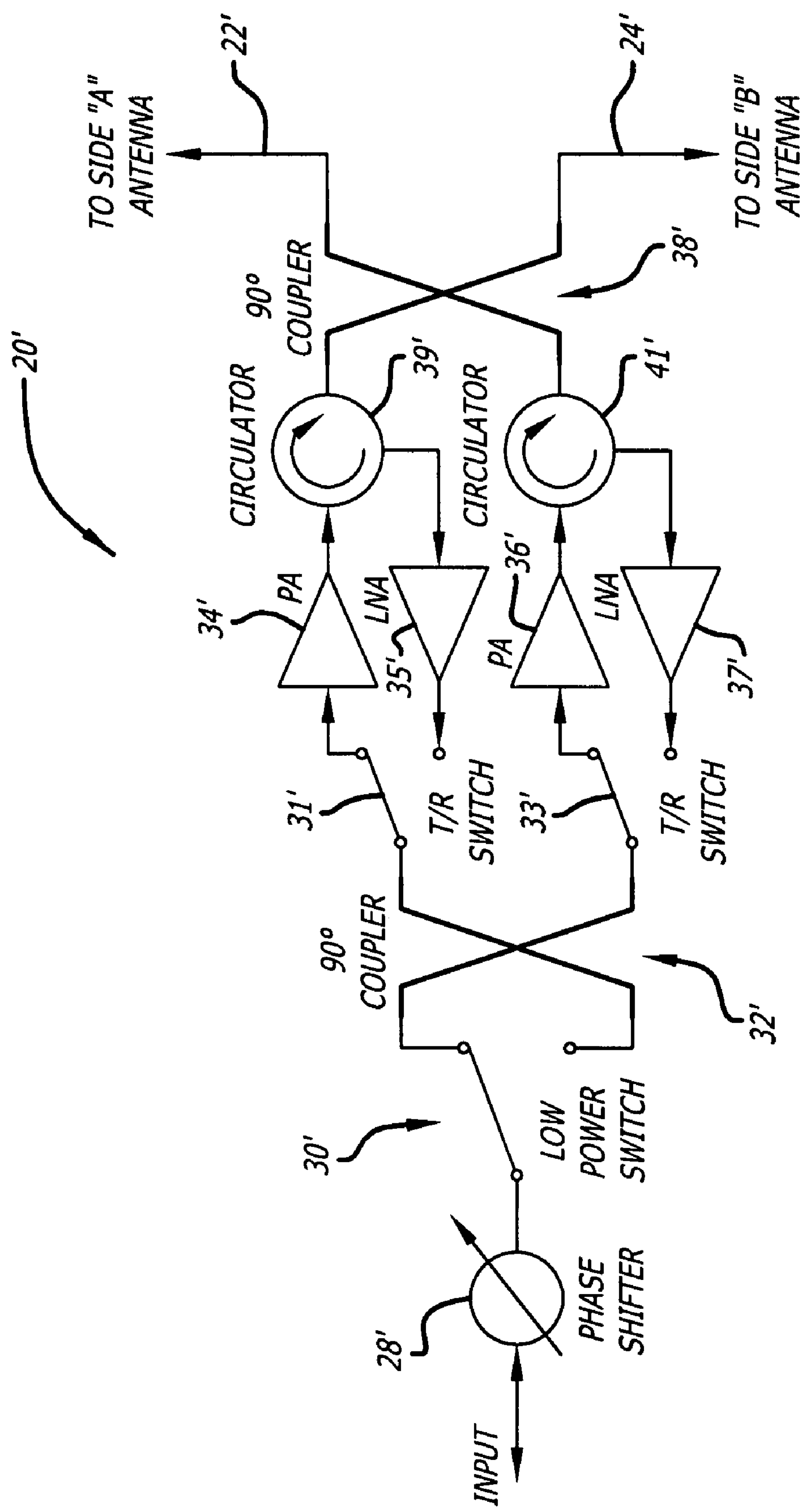
FIG. 3 is simplified schematic diagram of a transmit/receive module implemented in accordance with the present teachings.

As illustrated in FIG. 3 below, the present teachings are not limited to a transmit only implementation.

FIG. 3 is simplified schematic diagram of a transmit/receive module implemented in accordance with the present teachings. In this module 20', first and second circulators 39' and 41' are included to direct signals received by the radiating elements 22' and 24' to first and second low noise amplifiers 35' and 38'. Additional switches 31' and 33' provide for transmit and receive switching modes. In the receive mode, the outputs of the receive amplifiers 35' and 37' are fed through the first coupler 32' and the first switch 30' to the variable phase shifter 28'.

Figure 4:
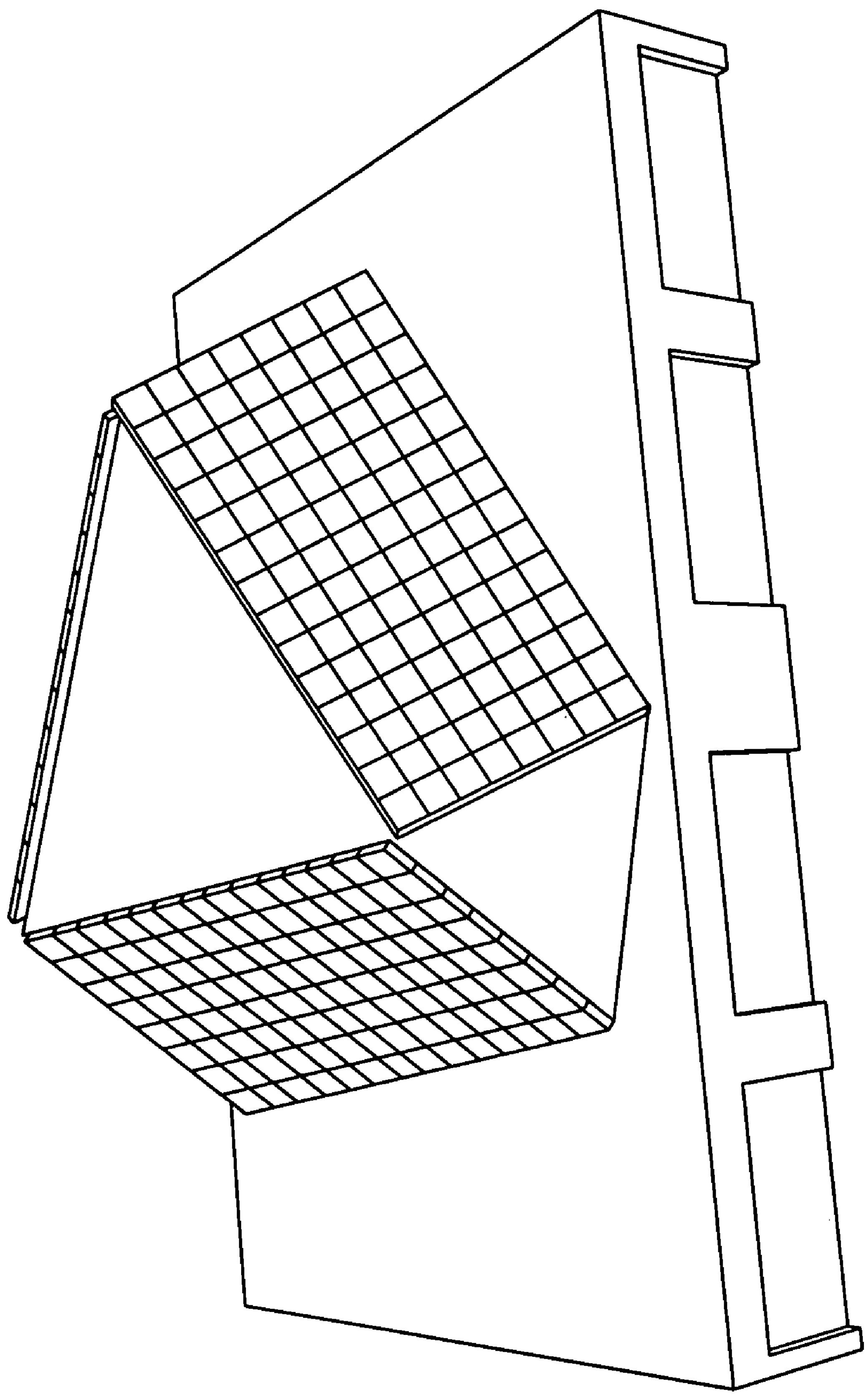
FIG. 4 is a simplified perspective view of an illustrative three-aperture implementation of the present teachings.

Further, the present invention is not limited to the two-aperture implementation of FIG. 1. FIG. 4 is a simplified perspective view of an illustrative three-aperture implementation of the present teachings. This arrangement provides coverage in three separate directions.

Figure 5:
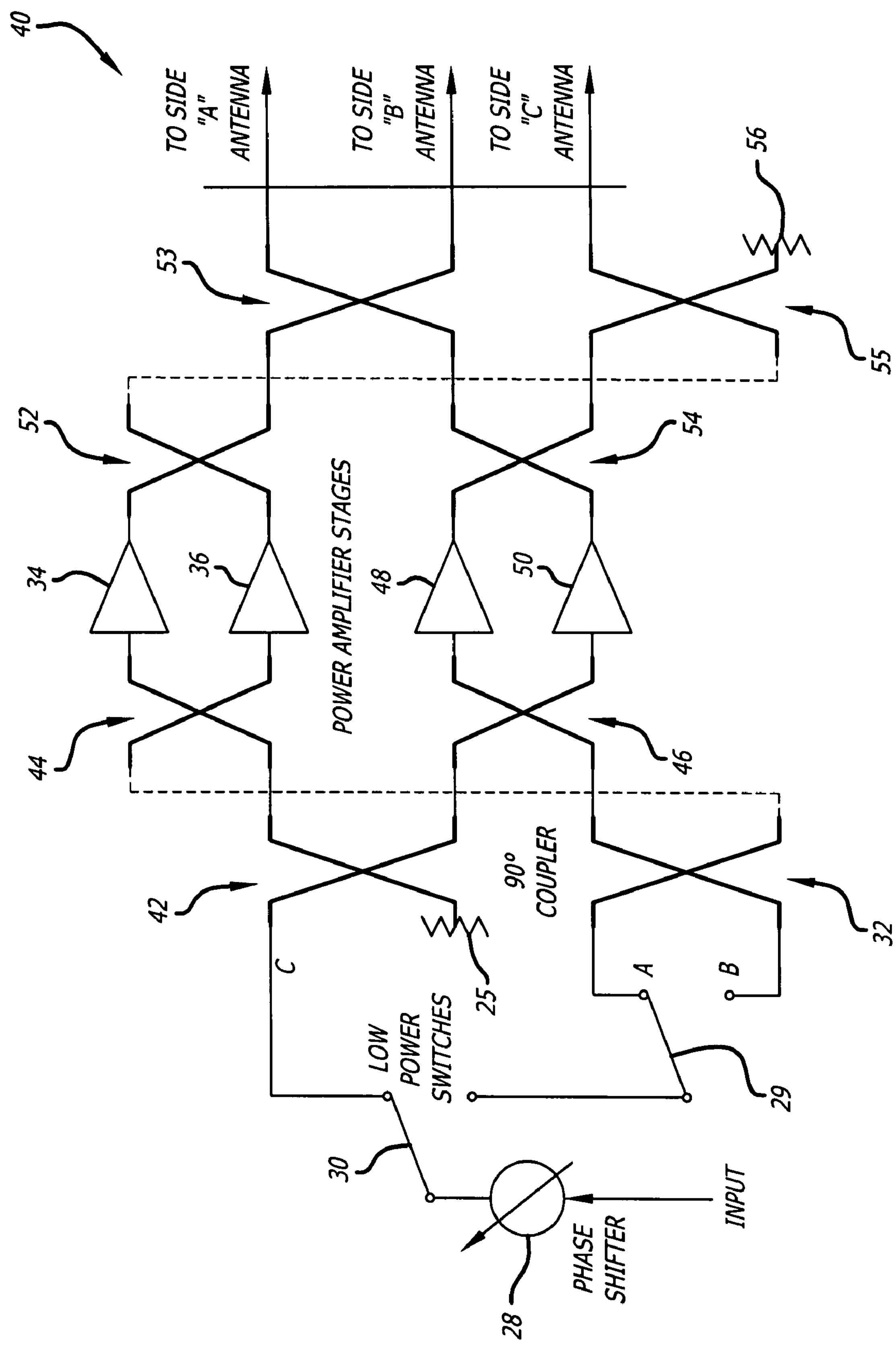
FIG. 5 is a simplified schematic diagram of a transmit module adapted for the three-aperture system of FIG. 4.

FIG. 5 is a simplified schematic diagram of a transmit module adapted for the three-aperture system of FIG. 4. As shown in FIG. 5, the phase shifter 28 feeds the first switch 30 as per the previous embodiments. A second low power switch 29 is added between the first switch and a first of two input couplers 32. The first coupler 32 is supplemented with second, third and fourth input side couplers 42, 44 and 46. The second coupler 42 is fed by the first switch 30 via one of the two throws thereof. The second coupler 42 has one side terminated with a resistor 25. The first and second couplers 32 and 42 each provide an input to the third and fourth couplers 44 and 46. The output ports of the third and fourth couplers 44 and 46 feed first, second, third and fourth power amplifiers 34, 36, 48 and 50. The outputs of the first, second, third and fourth power amplifiers 34, 36, 48 and 50 feed the input ports of fifth and sixth couplers 52 and 54, each of which, in turn, provide an input to both the seventh and eighth couplers 53 and 55. The two outputs from one output coupler (e.g. 53) and one output from the other output coupler (e.g. 55) feed the three apertures (phased arrays) depicted in FIG. 4.

Figure 6:
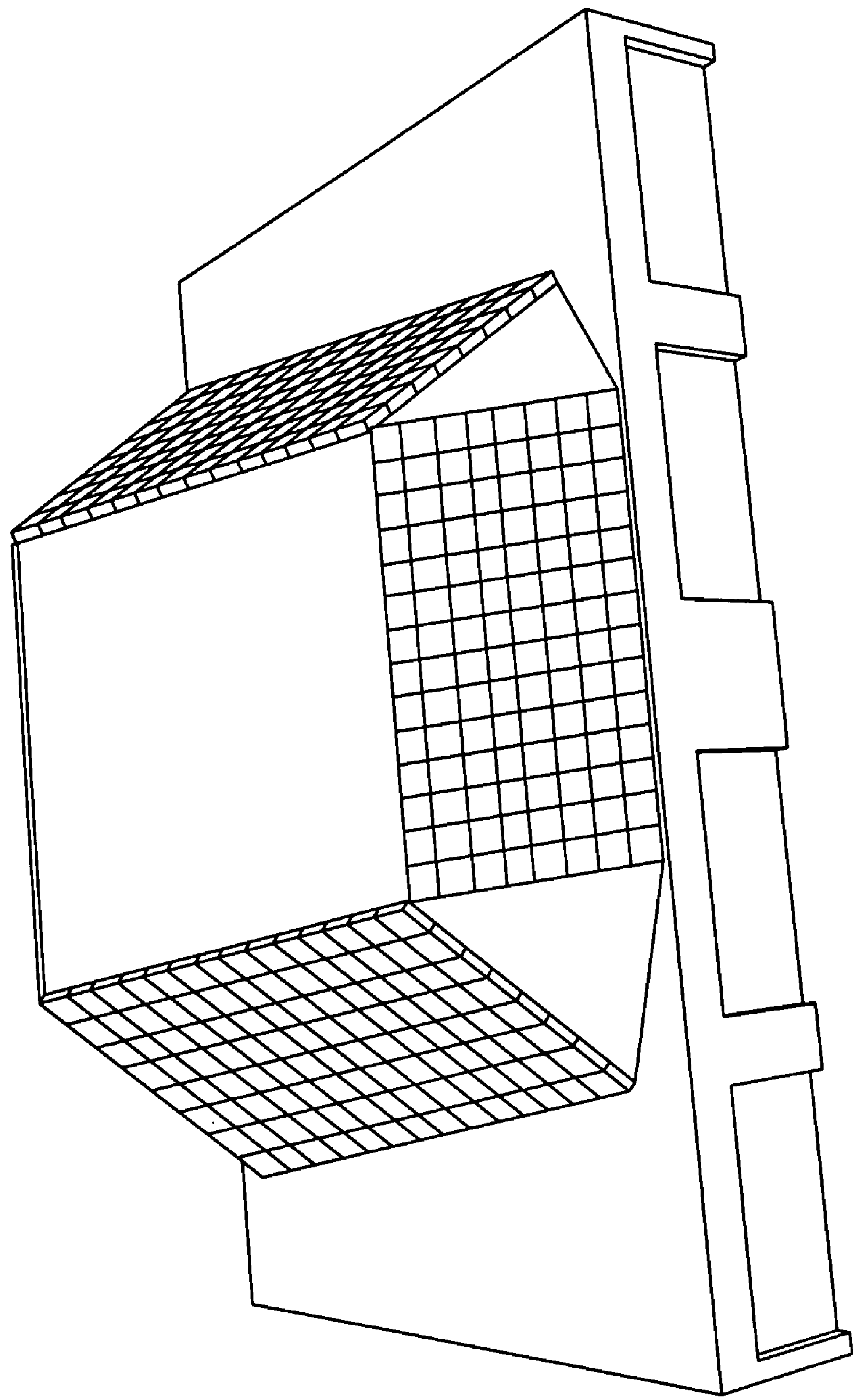
FIG. 6 is a simplified perspective view of an illustrative four-aperture implementation of the present teachings.

FIG. 6 is a simplified perspective view of an illustrative four-aperture implementation of the present teachings. This arrangement provides coverage in four separate directions.

Figure 7:
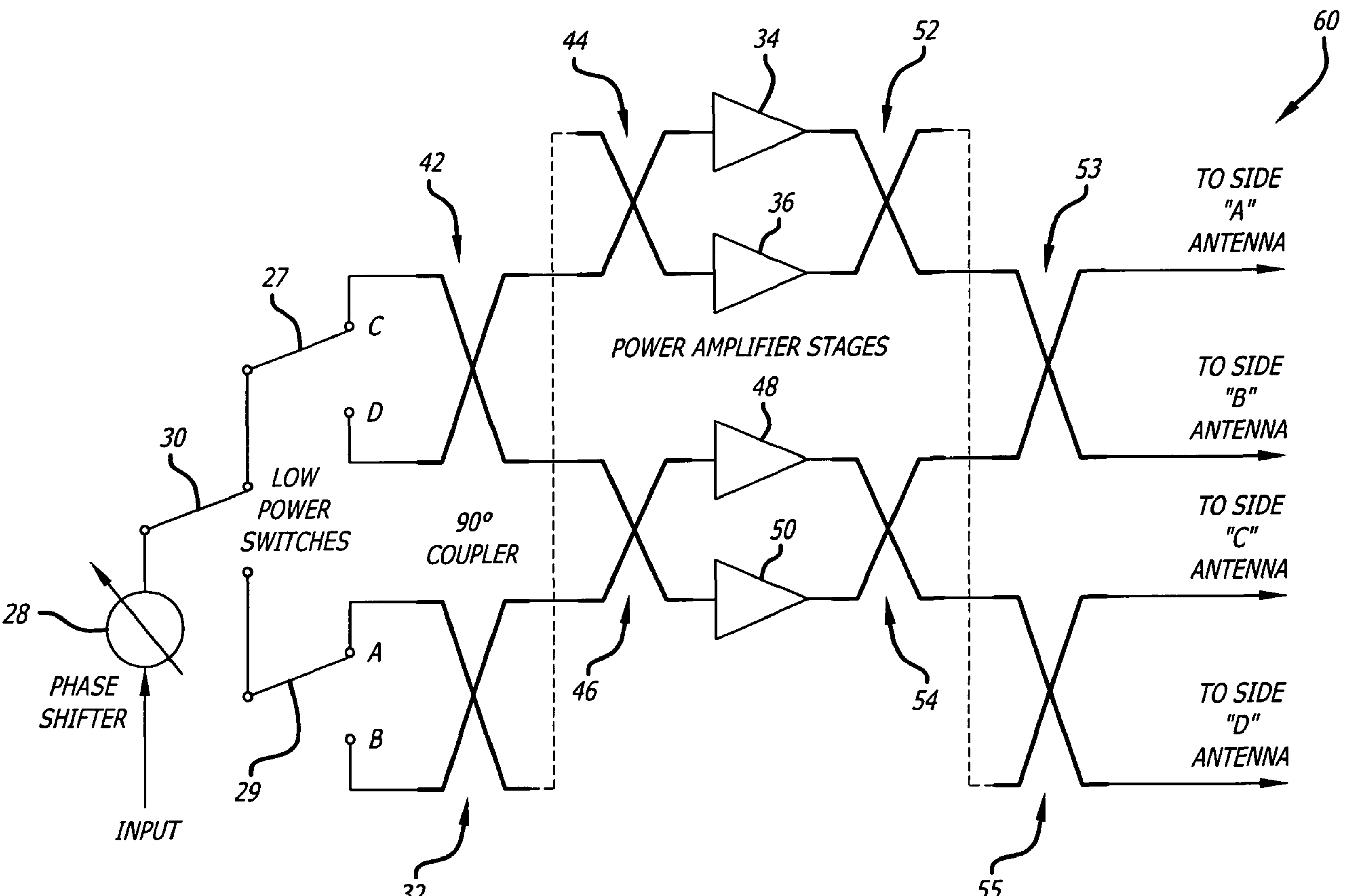
FIG. 7 is a simplified schematic diagram of a transmit module adapted for the four-aperture system of FIG. 6.

FIG. 7 is a simplified schematic diagram of a transmit module adapted for the four-aperture system of FIG. 6. This module 60 may be identical to the module 40 of FIG. 5 with the exception that a third input switch 27 is added, the resistor 25 is replaced with a connection to a throw of the switch 27 and the resistor 56 that terminates the second port of the output coupler 55 in FIG. 5 is removed and the port is connected to the fourth aperture depicted in FIG. 6.

In accordance with the present teachings, the transmit modules depicted in FIGS. 5 and 7 may be implemented as receive or transmit and receive modules per the teachings of FIG. 3.

Beam steering may be effected in a conventional manner using the arrangement such as that shown in the above-referenced copending U.S. patent application Ser. No. 11/423,520 entitled ANTI-MISSILE SYSTEM AND METHOD, filed Jun. 12, 2006 by Kenneth W. Brown et al.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A multi-aperture phased-array antenna system with shared transmit modules for selectively directing a beam of energy from one of the apertures, the system comprising:

a plurality of antenna apertures, each aperture having an array of radiating elements; and a plurality of transmit modules, each transmit module coupled to one radiating element of each of the apertures and configured to selectively provide a high power output signal to a radiating element of only one of the apertures, wherein each transmit module comprises:

a variable phase shifter (28) to receive a lower-power microwave signal;

a first low-power switch (30) to receive the lower-power microwave signal from the variable phase shifter (28);

a second low-power switch (27) to receive the lower-power microwave signal from a first output of the first low-power switch (30);

a third low-power switch (29) to receive the lower-power microwave signal from a second output of the first low-power switch (30);

a first ninety-degree input coupler (32) to receive to receive the lower-power microwave signal from the third low-power switch (29);

a second ninety-degree input coupler (42) to receive the lower-power microwave signal from the second low-power switch, a third ninety-degree input coupler (44) to receive the lower-power microwave signal from either a first output of the second ninety-degree input coupler (42) or a second output of the first ninety-degree input coupler (32);

a fourth ninety-degree input coupler (46) to receive the lower-power microwave signal from either a second output of the second ninety-degree input coupler (42) or a first output of the first ninety-degree input coupler (32);

a first power amplification stage (34) to amplify the lower-power microwave signal provided by a first output of the third ninety-degree input coupler (44) to generate a higher-power microwave signal;

a second power amplification stage (36) to amplify the lower-power microwave signal provided by a second output of the third ninety-degree input coupler (44) to generate a higher-power microwave signal;

a third power amplification stage (48) to amplify the lower-power microwave signal provided by a first output of the fourth ninety-degree input coupler (46) to generate a higher-power microwave signal;

a fourth power amplification stage (50) to amplify the lower-power microwave signal provided by a second output of the fourth ninety-degree input coupler (46) to generate a higher-power microwave signal;

a first ninety-degree output coupler (52) to combine the higher-power microwave signal from the first power amplification stage (34) with the higher-power microwave signal from the second power amplification stage (36);

a second ninety-degree output coupler (54) to combine the higher-power microwave signal from the third power amplification stage (48) with the higher-power microwave signal from the fourth power amplification stage (50);

a third ninety-degree output coupler (53) to combine the higher-power microwave signal from a second output of the first ninety-degree output coupler (52) with a first output of the second ninety-degree output coupler (54); and a fourth ninety-degree output coupler (55) to combine the higher-power microwave signal from a first output of the first ninety-degree output coupler (52) with a second output of the second ninety-degree output coupler (54).

2. The system of claim 1 wherein:

the higher-power microwave signal for a first of the antenna apertures is provided by a first output of the third ninety-degree output coupler (53);

the higher-power microwave signal for a second of the antenna apertures is provided by a second output of the third ninety-degree output coupler (53);

the higher-power microwave signal for a third of the antenna apertures is provided by a first output of the fourth ninety-degree output coupler (55); and the higher-power microwave signal for a fourth of the antenna apertures is provided by a second output of the fourth ninety-degree output coupler (55), wherein configuration of the first, second and third switches allows the beam of energy in excess of one kilowatt to be directed from a selected one of the antenna apertures.

3. The system of claim 2 wherein phasing imparted on the lower-power microwave signals by the first, second, third and fourth ninety-degree input couplers and the in-phase combining and cancellation of the higher-power microwave signals by the first, second, third and fourth ninety-degree output couplers provide the higher-power microwave signal at a selected one of the antenna apertures, wherein the selected one of the antenna apertures is selected based on a configuration of the first, second and third low-power switches.

4. The system of claim 3 wherein the first low-power switch is configured to selectively couple the lower-power microwave signal from the output of the variable phase shifter between inputs of either the second or third low-power switches, wherein the second low-power switch is configured to selectively couple the lower-power microwave signal between either first or second input ports of the second ninety-degree coupler, and wherein the third low-power switch is configured to selectively couple the lower-power microwave signal between either first or second input ports of the first ninety-degree coupler.

5. The system of claim 3 wherein the variable phase shifter of each transmit module is configured to vary the phase of the lower-power microwave signal to allow the beam from the selected one of the antenna apertures to be steered to track a target.

6. The system of claim 5 wherein the antenna system is part of a directed-energy airport missile defense system for airport defense, and wherein the apertures are positioned 180 degrees apart to align with an airport runway to provide coverage in opposite directions.

7. The system of claim 6 wherein the beam of energy is steered to irradiate a guided missile using targeting data received from a control node, and the system is configured to switch between selected apertures.

8. The system of claim 1 wherein the first, second, third and fourth amplification stages operate in parallel, each stage to amplify the lower-power microwave signal provided by outputs of either the third or fourth ninety-degree input coupler.

9. A multi-aperture phased-array antenna system with shared transmit modules for selectively directing a beam of energy from one of the apertures, the system comprising:

a plurality of antenna apertures, each aperture having an array of radiating elements; and a plurality of transmit modules, each transmit module coupled to one radiating element of each of the apertures and configured to selectively provide a high power output signal to a radiating element of only one of the apertures, wherein each transmit module comprises:

a variable phase shifter (28) to receive a lower-power microwave signal;

a first low-power switch (30) to receive the lower-power microwave signal from the variable phase shifter (28);

a second low-power switch (29) to receive the lower-power microwave signal from a second output of the first low-power switch (30);

a first ninety-degree input coupler (32) to receive to receive the lower-power microwave signal from the third low-power switch (29);

a second ninety-degree input coupler (42) to receive the lower-power microwave signal from a first output of the first low-power switch (30);

a third ninety-degree input coupler (44) to receive the lower-power microwave signal from either a first output of the second ninety-degree input coupler (42) or a second output of the first ninety-degree input coupler (32);

a fourth ninety-degree input coupler (46) to receive the lower-power microwave signal from either a second output of the second ninety-degree input coupler (42) or a first output of the first ninety-degree input coupler (32);

a first power amplification stage (34) to amplify the lower-power microwave signal provided by a first output of the third ninety-degree input coupler (44) to generate a higher-power microwave signal;

a second power amplification stage (36) to amplify the lower-power microwave signal provided by a second output of the third ninety-degree input coupler (44) to generate a higher-power microwave signal;

a third power amplification stage (48) to amplify the lower-power microwave signal provided by a first output of the fourth ninety-degree input coupler (46) to generate a higher-power microwave signal;

a fourth power amplification stage (50) to amplify the lower-power microwave signal provided by a second output of the fourth ninety-degree input coupler (46) to generate a higher-power microwave signal;

a first ninety-degree output coupler (52) to combine the higher-power microwave signal from the first power amplification stage (34) with the higher-power microwave signal from the second power amplification stage (36);

a second ninety-degree output coupler (54) to combine the higher-power microwave signal from the third power amplification stage (48) with the higher-power microwave signal from the fourth power amplification stage (50);

a third ninety-degree output coupler (53) to combine the higher-power microwave signal from a second output of the first ninety-degree output coupler (52) with a first output of the second ninety-degree output coupler (54); and a fourth ninety-degree output coupler (55) to combine the higher-power microwave signal from a first output of the first ninety-degree output coupler (52) with a second output of the second ninety-degree output coupler (54).

10. The system of claim 9 wherein:

the higher-power microwave signal for a first of the antenna apertures is provided by a first output of the third ninety-degree output coupler (53);

the higher-power microwave signal for a second of the antenna apertures is provided by a second output of the third ninety-degree output coupler (53); and the higher-power microwave signal for a third of the antenna apertures is provided by a first output of the fourth ninety-degree output coupler (55), wherein a second output (56) of the fourth ninety-degree output coupler (55) is terminated; and wherein configuration of the first and second low-power switches allows the beam of energy in excess of one kilowatt to be directed from a selected one of the antenna apertures.

11. The system of claim 10 wherein the first low-power switch is configured to selectively couple the lower-power microwave signal from the output of the variable phase shifter between an input of either the second low-power switch or an input of the second ninety-degree coupler, and wherein the second low-power switch is configured to selectively couple the lower-power microwave signal between either first or second input ports of the first ninety-degree coupler.

* * * * *